United States Patent [19]

Camilletti et al.

[11] Patent Number: 5,744,244
[45] Date of Patent: Apr. 28, 1998

[54] TAMPER-PROOF ELECTRONIC COATINGS

[75] Inventors: Robert Charles Camilletti; Loren Andrew Haluska; Keith Winton Michael, all of Midland, Mich.

[73] Assignee: Dow Corning Corporation, Midland, Mich.

[21] Appl. No.: 878,134

[22] Filed: Jun. 19, 1997

Related U.S. Application Data

[62] Division of Ser. No. 548,851, Oct. 26, 1995, Pat. No. 5,693,701.
[51] Int. Cl.$^6$ ........................................................ B32B 9/04
[52] U.S. Cl. .................. 428/447; 427/376.1; 427/376.2; 501/87; 501/88
[58] Field of Search ........................... 427/376.1, 376.2; 501/87, 88; 428/447

[56] References Cited

U.S. PATENT DOCUMENTS

| | | |
|---|---|---|
| 3,986,997 | 10/1976 | Clark . |
| 4,448,919 | 5/1984 | Murase . |
| 4,749,631 | 6/1988 | Haluska et al. . |
| 4,756,977 | 7/1988 | Haluska et al. . |
| 5,399,441 | 3/1995 | Bearinger et al. . |
| 5,516,596 | 5/1996 | Camilletti et al. . |
| 5,548,912 | 8/1996 | Camilletti et al. . |

*Primary Examiner*—Melvyn I. Marquis
*Attorney, Agent, or Firm*—Sharon K. Severance

[57] ABSTRACT

Disclosed is a method of forming tamper-proof coatings on electronic devices. The method comprises applying a coating of a silica precursor resin and an inorganic salt onto the electronic device, wherein the inorganic salt is one which reacts with a wet etch to yield an acid or base that damages the electronic device. The coated electronic device is then heated at a temperature sufficient to convert the silica precursor resin to a silica containing ceramic matrix.

12 Claims, No Drawings

TAMPER-PROOF ELECTRONIC COATINGS

This application is a division of application Ser. No. 08/548,851 filed Oct. 26, 1995 which application is now: U.S. Pat. No. 5,693,701.

BACKGROUND OF THE INVENTION

The dissection of electronic devices is a major source of information for both commercial competitors as well as foreign governments. In most instances, the devices are analyzed by techniques such as cross-sectioning and etching. The present invention relates to coatings comprising silica-containing matrices containing inorganic salts which inhibit this type of examination.

The use of silica-containing ceramic coatings on substrates such as electronic devices is known in the art. For instance, Haluska et al. in U.S. Pat. Nos. 4,749,631 and 4,756,977 disclose processes for forming silica coatings on electronic substrates wherein solutions of silica precursor resins are applied to substrates followed by heating the coated substrates in air at a temperature in the range of 200°–1000° C. These references, however, do not describe the use of inorganic salts within the coating.

Similarly, the use of fillers within ceramic coatings is also known in the art. For instance, U.S. Pat. No. 3,986,997 describes a composition comprising an acidic dispersion of colloidal silica and hydroxylated silsesquioxane in an alcohol-water medium which can be used to apply transparent abrasion resistant coatings on a variety of substrates. The reference, however, does not describe the use of the inorganic salts described herein nor the application of a coating on an electronic substrate.

U.S. patent application 08/103,142 filed Aug. 09,1993, U.S. Pat. No. 5,458,912 teaches tamper-proof coatings on electronic devices. The coatings therein comprise silica-containing matrices with materials such as metals therein which react in oxidizing atmospheres to destroy the underlying device. This reference, too, does not describe the use of the inorganic salts taught herein.

The present inventors have now discovered that tamper-proof coatings for electronic circuits can be formed from compositions comprising silica precursor resins and inorganic salts.

SUMMARY OF THE INVENTION

The present invention relates to a method of forming a tamper-proof coating on an electronic substrate and the substrate coated thereby. The method comprises first applying a composition comprising a silica precursor resin and an inorganic salt onto the substrate. The inorganic salt used is one which reacts with a wet etch to yield an acid or base that damages the electronic device. The coated substrate is then heated at a temperature sufficient to convert the coating composition to a ceramic coating.

The present invention also relates to the coating composition comprising the above silica precursor resin and an inorganic salt.

DETAILED DESCRIPTION OF THE INVENTION

The present invention is based on the discovery that tamper-proof coatings can be formed from compositions comprising silica precursor resins and inorganic salts. When these coatings are analyzed by wet etching, the inorganic salts react to yield acids or bases (localized changes in pH) which cause uncontrollable destruction of the underlying metallization or substrate and, thus, inhibit further examination and/or reverse engineering.

As used in the present invention, the expression "silica containing matrix" is used to describe the hard coating obtained after heating the silica precursor resin. This coating contains both amorphous silica ($SiO_2$) materials as well as amorphous silica-like materials that are not fully free of residual carbon, silanol (Si-OH) and/or hydrogen (which are obtained upon heating the silica precursor resin) and the inorganic salts. The expression "filler" is used to describe a finely divided solid phase which is distributed within the resin and the final ceramic coating. The expression "electronic substrate" is meant to include, but is not limited to, electronic devices or electronic circuits such as silicon based devices such as integrated circuits, gallium arsenide based devices, focal plane arrays, opto-electronic devices, photovoltaic cells and optical devices. The "wet etch" described herein involves the use of water, alkaline or acidic solutions to etch a variety of coatings. This process is well known and commonly used in the semiconductor industry.

In the process of the present invention a ceramic coating is formed on a substrate by a process which comprises applying a coating composition comprising a silica precursor resin and the inorganic salt onto the substrate and then heating the coated substrate at a temperature sufficient to convert the composition to a silica-containing ceramic matrix having the inorganic salt distributed therein.

The silica precursor resins which may be used in the invention include, but are not limited to, hydrogen silsesquioxane resin (H-resin), hydrolyzed or partially hydrolyzed $R_nSi(OR)_{4-n}$, or combinations of the above, in which R is an aliphatic, alicyclic or aromatic substituent of 1–20 carbon atoms such as an alkyl (eg. methyl, ethyl, propyl), alkenyl (eg. vinyl or allyl), alkynyl (eg. ethynyl), cyclopentyl, cyclohexyl, phenyl etc., and n is 0–3.

The hydrogen silsesquioxane resins (H-resin) which may be used in this invention include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, x=0–2, y=0–2, z=1–3, x+y+z=3. Examples of R include alkyls such as methyl, ethyl, propyl, butyl, etc., aryls such as phenyl, and alkenyls such as allyl or vinyl. As such, these resins may be fully condensed $(HSiO_{3/2})_n$ or they may be only partially hydrolyzed (i.e., containing some Si-OR) and/or partially condensed (i.e., containing some Si-OH). Although not represented by this structure, these resins may contain a small number (eg., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

The second type of silica precursor resin useful herein includes hydrolyzed or partially hydrolyzed compounds of the formula $R_nSi(OR)_{4-n}$ in which R and n are as defined above. Some of these materials are commercially available, for example, under the tradename ACCUGLASS. Specific compounds of this type include methyltriethoxysilane, phenyltriethoxysilane, diethyldiethoxysilane, methyltrimethoxysilane, dimethyldimethoxysilane, phenyltrimethoxysilane, vinyltrimethoxysilane, tetramethoxysilane, tetraethoxysilane, tetrapropoxysilane, and tetrabutoxysilane. After hydrolysis or partial hydrolysis of these compounds, the silicon atoms therein may be bonded to C, OH or OR groups, but a substantial portion of the material is believed to be condensed in the form of soluble Si-O-Si resins. Compounds in which x=2 are generally not used alone as volatile cyclic structures are generated during pyrolysis, but small amounts of said compounds may be cohydrolyzed with other silanes to prepare useful preceramic materials.

The coating composition may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When hydrogen silsesquioxane resin is to be combined with one of the above ceramic oxide precursors, generally it is used in an amount such that the final ceramic coating contains 0.1 to about 30 percent by weight modifying ceramic oxide.

The coating composition may also contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The inorganic salts used herein are those which react with wet etch to yield acids or bases that cause uncontrolled damage to the underlying electronic devices. These include, for example, the sodium, potassium, calcium and ammonium salts of phosphates, halides, nitrates, nitrites, chlorates, sulfates, sulfites, chromates and the like. Examples include sodium fluoride, calcium fluoride, sodium nitrate, sodium sulfate, ammonium fluoride and the like.

The particle size and shape of the above inorganic salts can vary over a wide range depending on factors such as the type of salt, the desired coating thickness, etc. Powder morphologies include, but are not limited to powders, particles, flakes and the like.

The amount of inorganic salt used in the present invention can also be varied over a wide range depending, for example, on the desired quality of the final coating. Generally, however, the inorganic salts are used in an amount less than about 90 weight percent of the coating to insure that enough resin is present to bind the inorganic salt. Obviously, smaller amounts of inorganic salts (eg., 1–5 wt%) can also be used. A preferred amount of inorganic salt is in the range of about 5 to about 80 wt. percent of the coating.

If desired, other materials may also be present in the coating composition. For instance, it is within the scope of the present invention to use a material which modifies the surface of the inorganic salt for better adhesion. Such materials can include, for example, silanes such as glycidoxypropyltrimethoxysilane, mercaptopropyltrimethoxysilane, and vinyltriacetoxysilane. Similarly, it is within the scope of the invention to include suspending agents to suspend the inorganic salts in the preceramic coating composition. These and other optional components are known to those skilled in the art.

According to the process of the invention, the silica precursor resin, inorganic salt and any optional components are applied to the surface of an electronic device. The surface of the electronic device can be bare (i.e., no passivation) or the circuit can have a primary passivation. Such primary passivation can be, for example, ceramic coatings such as silica, silicon nitride, silicon carbide, silicon oxynitride, silicon oxycarbide, etc. deposited by, for example, CVD such as thermal CVD, PECVD, etc., PVD, or sol-gel approaches. Such primary passivation is known to those skilled in the art.

The coating according to the present invention can be applied in any manner, but a preferred method involves dissolving the silica precursor resin in a solvent and dispersing the inorganic salt and any optional components therein. This dispersion is then applied to the surface of the substrate. Various facilitating measures such as stirring and/or heating may be used to dissolve or disperse the silica precursor resin and inorganic salt and create a more uniform application material. Solvents which may be used include any agent or mixture of agents which will dissolve or disperse the silica precursor resin and inorganic salt to form a homogenous liquid mixture without affecting the resultant coating. These solvents can include, for example, alcohols such as ethyl or isopropyl, aromatic hydrocarbons such as benzene or toluene, alkanes such as n-heptane or dodecane, ketones, esters, glycol ethers, or cyclic dimethylpolysiloxanes, in an amount sufficient to dissolve/disperse the above materials to the concentration desired for application. Generally, enough of the above solvent is used to form a 0.1–80 weight percent solids mixture, preferably 1–50 wt. percent solids.

If a liquid method is used, the liquid mixture comprising the silica precursor resin, inorganic salt, solvent, and, any optional components is then coated onto the substrate. The method of coating can be, but is not limited to, spin coating, dip coating, spray coating or flow coating. Other equivalent means, however, are also deemed to be within the scope of this invention. If desired, the liquid mixture can be selectively deposited as described in U.S. Pat. No. 5,399,441 which is incorporated herein by reference.

The solvent is then allowed to evaporate from the coated substrate resulting in the deposition of the silica precursor resin and inorganic salt coating. Any suitable means of evaporation may be used such as simple air drying by exposure to an ambient environment, by the application of a vacuum or mild heat or during the early stages of the heat treatment. It is to be noted that when spin coating is used, the additional drying period is minimized as the spinning drives off the solvent.

Although the above described methods primarily focus on using a solution approach, one skilled in the art would recognize that other equivalent means (eg., melt coating) would also function herein and are contemplated to be within the scope of this invention.

The silica precursor resin and inorganic salt coating is then typically converted to a silica-containing ceramic matrix having the inorganic salt distributed therein by heating it to a sufficient temperature. Generally, the temperature is in the range of about 50° to about 1000° C. depending on the pyrolysis atmosphere. Preferred temperatures are in the range of about 50° to about 800° C. and more preferably 50°–450° C. to prevent damage to the electronic device. Heating is generally conducted for a time sufficient to ceramify, generally up to about 6 hours, with less than about 3 hours being preferred.

The above heating may be conducted at any effective atmospheric pressure from vacuum to superatmospheric and under any effective oxidizing or non-oxidizing gaseous environment such as those comprising air, $O_2$, ozone, an inert gas ($N_2$, Ar etc.), ammonia, amines, $N_2O$, $H_2$ etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods a ceramic coating is produced on the substrate. The thickness of the coating can vary over a wide range (eg., up to 500 microns) as described above. These coatings smooth the irregular surfaces of various substrates, they are relatively defect free and they have excellent adhesive properties. As such, they are particularly useful for a variety of electronic applications such as protective layers. In addition, the coatings are tamper-proof such that examination by wet etching causes the inorganic salt to be converted into an acid or base which results in destruction of the electronic device.

Additional coatings may be applied over these coatings if desired. These can include, for example, $SiO_2$ coatings, $SiO_2$/ ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings. Methods for the application of such coatings are known in the art and many are described in U.S. Pat. No. 4,756,977, which is incorporated herein by reference. An especially preferred coating is silicon carbide applied by the chemical vapor deposition of an organosilicon precursor. One example of such a process is described in U.S. Pat. No. 5,011,706 which is incorporated herein by reference. A second example involves the chemical vapor deposition utilizing trimethyl silane as the source gas. The most preferred coating comprises silicon carbide deposited in a non-uniform thickness such that uniform etching is difficult.

The following non-limiting example is included so that one skilled in the art may more readily understand the invention.

EXAMPLE 1

A coating composition was formed by mixing 3 g $CaF_2$, 1 g of Hydrogen silsesquioxane resin made by the method of Collins et al. in U.S. Pat. No. 3,615,273, and 0.4 g glycidoxypropyltrimethoxysilane and 2.5 g cyclic polydimethylsiloxane. The above mixture was subjected to a sonic probe 3 times for 10 seconds each. The coating composition was applied to the surface of an 11.4 cm square aluminum panel using a 50 cm drawdown bar. The coating was allowed to dry for 3 hours at room temperature. The coated panels were then heated at 400° C. for 1 hour in air.

The resultant coating was 35 micrometers thick. Examination of the coating under a microscope showed no cracks at 1000×.

What is claimed is:

1. A method of forming a tamper-proof coating on an electronic device comprising:

applying a coating composition comprising a silica precursor resin and an inorganic salt onto an electronic device, wherein the inorganic salt is one which reacts with a wet etch to yield an acid or base that damages the electronic device; and heating the coated substrate at a temperature sufficient to convert the coating composition into a ceramic coating.

2. The method of claim 1 wherein the coating composition is applied to the substrate by a process which comprises coating the substrate with a liquid mixture comprising a solvent, the silica precursor resin and the inorganic salt and then evaporating the solvent.

3. The method of claim 1 wherein the silica precursor resin is selected from the group consisting of hydrogen silsesquioxane resin and hydrolyzed or partially hydrolyzed $R_nSi(OR)_{4-n}$, wherein R is an aliphatic, alicyclic or aromatic substituent of 1–20 carbon atoms and n is 0–3.

4. The method of claim 1 wherein the coated substrate is heated at a temperature in the range of between about 50° C. and about 450° C. for less than about 3 hours.

5. The method of claim 1 wherein the coating composition also contains modifying ceramic oxide precursors comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy and acyloxy and the compound is present in an amount such that the ceramic coating contains 0.1 to 30 percent by weight modifying ceramic oxide.

6. The method of claim 3 wherein the silica precursor resin is hydrogen silsesquioxane resin and the coating composition also contains a platinum, rhodium or copper catalyst in an amount of between about 5 and about 500 ppm platinum, rhodium or copper based on the weight of hydrogen silsesquioxane resin.

7. The method of claim 1 wherein the coating composition also contains a material which modifies the surface of the inorganic salt for better adhesion.

8. The method of claim 2 wherein the coating composition also contains an agent which assists in suspending the inorganic salt in the solution.

9. The method of claim 1 wherein the inorganic salt is in a form selected from the group consisting of powders, particles, and flakes.

10. The method of claim 1 wherein the inorganic salt is selected from the group consisting of salts of phosphates, halides, nitrates, nitrites, chlorates, sulfates, sulfites and chromates.

11. The method of claim 1 wherein the inorganic salt is present in the coating composition in an amount in the range of about 10 to about 80 weight percent.

12. The electronic device coated by the method of claim 1.

* * * * *